US010008481B2

(12) United States Patent
Yamauchi et al.

(10) Patent No.: US 10,008,481 B2
(45) Date of Patent: Jun. 26, 2018

(54) METHOD OF MANUFACTURING ILLUMINATION DEVICE, ILLUMINATION DEVICE, ILLUMINATION DEVICE MANUFACTURING SYSTEM, METHOD OF CLASSIFYING COLOR TONE OF LIGHT EMITTING DEVICES, AND METHOD OF CLASSIFYING LIGHT EMITTING DEVICES

(71) Applicant: NICHIA CORPORATION, Anan-shi (JP)

(72) Inventors: Shigeharu Yamauchi, Duluth, GA (US); Nobuyuki Furukawa, Itano-gun (JP)

(73) Assignee: NICHIA CORPORATION, Anan-shi (JP)

( * ) Notice: Subject to any disclaimer, the term of this patent is extended or adjusted under 35 U.S.C. 154(b) by 224 days.

(21) Appl. No.: 14/657,846

(22) Filed: Mar. 13, 2015

(65) Prior Publication Data

US 2015/0262979 A1    Sep. 17, 2015

(30) Foreign Application Priority Data

Mar. 15, 2014   (JP) .................................. 2014-052846
Mar. 3, 2015    (JP) .................................. 2015-041827

(51) Int. Cl.
*H01L 25/075*    (2006.01)
*H01L 33/50*    (2010.01)
(Continued)

(52) U.S. Cl.
CPC ............ *H01L 25/0753* (2013.01); *F21K 9/90* (2013.01); *H01L 33/50* (2013.01); *H01L 33/52* (2013.01);
(Continued)

(58) Field of Classification Search
CPC .......... G01J 3/46; H01L 25/0753; H01L 33/50
See application file for complete search history.

(56) References Cited

U.S. PATENT DOCUMENTS 8,531,668 B2 * 9/2013 Michel ...................... G01J 3/46
356/402
2011/0291123 A1   12/2011   Hofmann et al.
2013/0082612 A1   4/2013   Kim et al.

FOREIGN PATENT DOCUMENTS

JP    2008-147563    4/2008
JP    2013-26237     2/2013
(Continued)

OTHER PUBLICATIONS

American National Standard Lighting Group, "ANSI_NEMA_ANSLG C78.377—2008 American National Standard for Electric Lamps—Specifications for the Chromaticity of Solid State Lighting Products ED", Jan. 1, 2008, pp. 1-17, XP002651927, See Cite No. 8.
(Continued)

*Primary Examiner* — Karabi Guharay
(74) *Attorney, Agent, or Firm* — Mori & Ward, LLP

(57) ABSTRACT

In a method of manufacturing an illumination device, a color tone of each of a plurality of light emitting devices having different color tones is detected. In which region among a first region, a second region, a third region, a fourth region, a fifth region, and a sixth region on a chromaticity diagram the color tone of each of the plurality of light emitting devices is determined based on the detected color tone. The chromaticity diagram has a first color tone area and a second color tone area in which the first color tone area is provided. The second color tone area is divided into the first region through the sixth region. The plurality of light emitting devices are classified into the first region through the sixth region based on the determined color tone.

24 Claims, 8 Drawing Sheets

(51) Int. Cl.
  *H01L 33/52*  (2010.01)
  *F21K 9/90*  (2016.01)
  *F21V 19/00*  (2006.01)
  *F21Y 115/10*  (2016.01)
  *F21Y 113/13*  (2016.01)

(52) U.S. Cl.
  CPC ......... *F21V 19/003* (2013.01); *F21Y 2113/13* (2016.08); *F21Y 2115/10* (2016.08); *H01L 2224/48091* (2013.01); *H01L 2224/48247* (2013.01); *H01L 2224/48257* (2013.01); *H01L 2924/181* (2013.01); *Y10T 29/4913* (2015.01)

(56) References Cited

FOREIGN PATENT DOCUMENTS

| | | |
|---|---|---|
| JP | 2013-45544 | 3/2013 |
| JP | 2013-45839 | 3/2013 |

OTHER PUBLICATIONS

Everlight, Datasheet "62-217-D/XK2C-SXXXXXXXXXXXZ 15/2T", Aug. 6, 2013, vol. 6, Issue No. DSE-0007940, www.everlight.com.
Philips LUMILEDS Lighting Company, "LUXEON Z and LUXEON Z ES DS120", Dec. 9, 2013, www.philipslumileds.com.
Everlight, Datasheet "Yi 5W Series", Oct. 27, 2011, Issue No. DHE-0001157, www.everlight.com.
Edison OPTO Corporation, "PLLC 3014 0.1W CRI 70 Datasheet", 2015, pp. 1-19, www.edison-opto.com
Extended European Search Report for coresponding EP Application No. 15158618.7-1757, Nov. 17, 2015.
MacAdam D.L., "Specification of Small Chromaticity Differences", Journal of the Optical Society of America, Jan. 1943, pp. 18-26, vol. 33, No. 1, New York.

* cited by examiner

CIE xy CHROMATICITY DIAGRAM

METHOD OF MANUFACTURING ILLUMINATION DEVICE, ILLUMINATION DEVICE, ILLUMINATION DEVICE MANUFACTURING SYSTEM, METHOD OF CLASSIFYING COLOR TONE OF LIGHT EMITTING DEVICES, AND METHOD OF CLASSIFYING LIGHT EMITTING DEVICES

CROSS-REFERENCE TO RELATED APPLICATIONS

The present application claims priority under 35 U. S. C. § 119 to Japanese Patent Application No. 2014-052846, filed Mar. 15, 2014 and Japanese Patent Application No. 2015-041827, filed Mar. 3, 2015 The contents of these applications are incorporated herein by reference in their entirety.

BACKGROUND OF THE INVENTION

1. Field of the Invention

The present invention relates to a method of manufacturing an illumination device, an illumination device, an illumination device manufacturing system, a method of classifying color tone of light emitting devices, and a method of classifying light emitting devices.

2. Description of the Related Art

In recent years, light emitting chips (semiconductor light emitting elements) as well as light emitting devices, which combine a light emitting element with phosphor material that absorbs light from the light emitting element and re-emits light at a different wavelength from the light emitting element, have been used in various types of illumination (lighting) devices. However, even when the light emitting devices are manufactured in the same manner, semiconductor chip and phosphor variation results in light emitting devices with different color temperature, chromaticity, and light intensity characteristics. For this reason, the light emitting devices are ranked and sorted (binned or graded) according to their light emission characteristics.

When multiple light emitting devices are used to manufacture illumination apparatus, it is desirable for all illumination apparatus to have uniform characteristics such as color temperature, chromaticity, and light flux. For example, lighting apparatus chromaticity range standards (refer to FIGS. 8 and 9) are specified by JIS (Japanese Industrial Standard) and ANSI (American National Standards Institute), and white-light obtained from an illumination apparatus may be required to be within a standard specified chromaticity range, or depending on the application, may be required to be within an even narrower chromaticity range. In particular, it is desirable for the light temperature to also be within a JIS specified light temperature along the black-body (radiator) locus (or Planck curve in color space).

However, standard light emitting device grade selection might be insufficient for producing illumination apparatus with this kind of minimal variation (dispersion) in illumination characteristics, and further (tighter) binning to obtain desired chromaticity or light flux results in increased manufacturing cost.

On the other hand, by combining light from light emitting devices that emit different colors, and specifically where those colors have a complementary relation, it is possible to produce light that appears (to the naked eye) as the targeted color. Consequently, various light emitting device mounting schemes have been proposed to produce an illumination device that emits light within a desired color range by assembling a plurality of component devices that individually emit different colors even outside the desired color range.

For example, with the purpose of making a pleasing white-light illumination apparatus for lighting applications, light emitting devices are used that have chromaticity located (in color space) outside the area of a 3-step MacAdam ellipse around a targeted color temperature, which lies on the black-body locus and is considered suitable for white-light illumination. A light emitting apparatus has been proposed (Japanese Laid-Open Patent Publication 2013-45544) that is characterized by a light emitting device module carrying a plurality of light emitting devices, which emit light that merges to emit with approximately the same chromaticity as the targeted chromaticity even though each of the plurality of light emitting devices has chromaticity lying outside the 3-step MacAdam ellipse at the targeted chromaticity.

In the manufacture of apparatus for light emitting device applications other than lighting, such as liquid crystal display backlighting, light emitting devices having the desired color temperature as well as light emitting devices having other color temperatures are used to produce an overall uniform color temperature. Manufacture results in different grades (color ranking) of the component light emitting devices and their maximum utilization is an (additional) issue. Accordingly, a method of manufacturing light emitting device application apparatus (Japanese Laid-Open Patent Publication 2008-147563) has been proposed with the following steps. A color temperature distribution data acquisition step gathers color temperature distribution data that include color temperature coordinates for light emitting devices manufactured at each designated production facility. An optimum color temperature grouping step identifies groups of light emitting devices, which emit merged light with a specified color temperature based on the acquired color temperature distribution data, and forms those groups in a manner that maximizes light emitting device utilization. An optimum color temperature sorting and mounting step sorts and mounts subgroups of light emitting devices identified as optimal for the light emitting device application apparatus such that the merged light of the subgroups has the prescribed color temperature.

SUMMARY OF THE INVENTION

According to one aspect of the present invention, in a method of manufacturing an illumination device, a color tone of each of a plurality of light emitting devices having different color tones is detected. In which region among a first region, a second region, a third region, a fourth region, a fifth region, and a sixth region on a chromaticity diagram the color tone of each of the plurality of light emitting devices is determined based on the detected color tone. The chromaticity diagram has a first color tone area and a second color tone area in which the first color tone area is provided. The second color tone area is divided into the first region through the sixth region. The plurality of light emitting devices are classified into the first region through the sixth region based on the determined color tone.

According to another aspect of the present invention, an illumination device is manufactured by a method. In the method, a color tone of each of a plurality of light emitting devices having different color tones is detected. In which region among a first region, a second region, a third region, a fourth region, a fifth region, and a sixth region on a chromaticity diagram the color tone of each of the plurality of light emitting devices is determined based on the detected color tone. The chromaticity diagram has a first color tone area and a second color tone area in which the first color tone area is provided. The second color tone area is divided into the first region through the sixth region. The plurality of light emitting devices are classified into the first region through the sixth region based on the determined color tone.

According to further aspect of the present invention, an illumination device manufacturing system includes memory, a first color tone bin, a first bin, a second bin, a third bin, a fourth bin, a fifth bin, a sixth bin, a color tone detector, a classifying device, and a mounting device. The memory is to store a reference chromaticity data including a range of chromaticity for color tone classifying which includes a first color tone area and a second color tone area in which the first color tone area is provided. The second color tone area is divided into a first region, a second region, a third region, a fourth region, a fifth region, and a sixth region. The first region and the second region are provided opposite to each other to sandwich the first color tone area between the first region and the second region. The third region and the fourth region are provided opposite to each other to sandwich the first color tone area between the third region and the fourth region. The fifth region and the sixth region are provided opposite to each other to sandwich the first color tone area between the fifth region and the sixth region. The first color tone bin, the first bin, the second bin, the third bin, the fourth bin, the fifth bin, and the sixth bin are provided to respectively correspond to the first color tone area and the first region through the sixth region. The color tone detector is configured to detect a color tone of each of a plurality of different color tone light emitting devices. The classifying device is configured to determine which of the first color tone area and the first region through the sixth region each of the plurality of different color tone light emitting devices belongs to based on the color tone detected by the color tone detector with reference to the reference chromaticity data stored in the memory so as to dispatch each of the plurality of different color tone light emitting devices into one of the first color tone bin and the first bin through the sixth bin. The mounting device is configured to extract from the plurality of different color tone light emitting devices dispatched in the first color tone bin and the first bin through the sixth bin first light emitting devices in the first bin and second light emitting devices in the second bin, and configured to mount the first light emitting devices and the second light emitting devices on a circuit board with disposition to merge and mix light output from the first light emitting devices and the second light emitting devices.

According to the other aspect of the present invention, in a method of classifying color tone of light emitting devices, each of a plurality of light emitting devices having different color tones is classified into a first region, a second region, a third region, a fourth region, a fifth region, and a sixth region in a color tone area including a first color tone area and a second color tone area in which the first color tone area is provided. The second color tone area is divided into the first region, the second region, the third region, the fourth region, the fifth region, and the sixth region. Outlines of the first region through the sixth region are defined by first three points of intersection on a perimeter of the second color tone area at which a triangle circumscribed outside the first color tone area intersects with the perimeter of the second color tone area and second three points of intersection on the perimeter of the second color tone area at which dividing lines that pass through the first three points of intersection and a center of the second color tone area intersect with the perimeter of the second color tone area.

According to the other aspect of the present invention, in a method of classifying light emitting devices, a color tone of each of a plurality of light emitting devices having different color tones is detected. In which region among a first region, a second region, a third region, a fourth region, a fifth region, and a sixth region on a chromaticity diagram the color tone of each of the plurality of light emitting devices is determined based on the detected color tone. The chromaticity diagram has a first color tone area and a second color tone area in which the first color tone area is provided. The second color tone area is divided into the first region through the sixth region. The plurality of light emitting devices are classified into the first region through the sixth region based on the determined color tone.

According to the other aspect of the present invention, in a method of manufacturing an illumination device, the illumination device is manufactured using a plurality of light emitting devices classified by a method. In the method, each of the plurality of light emitting devices having different color tones is classified into a first region, a second region, a third region, a fourth region, a fifth region and a sixth region in a color tone area including a first color tone area and a second color tone area in which the first color tone area is provided. The second color tone area is divided into the first region, the second region, the third region, the fourth region, the fifth region and the sixth region. Outlines of the first region through the sixth region are defined by first three points of intersection on a perimeter of the second color tone area at which a triangle circumscribed outside the first color tone area intersects with the perimeter of the second color tone area and second three points of intersection on the perimeter of the second color tone area at which dividing lines that pass through the first three points of intersection and a center of the second color tone area intersect with the perimeter of the second color tone area.

According to the other aspect of the present invention, an illumination device is manufactured by a method. In the method, the illumination device is manufactured using a plurality of light emitting devices classified by a method. In the method, each of the plurality of light emitting devices having different color tones is classified into a first region, a second region, a third region, a fourth region, a fifth region and a sixth region in a color tone area including a first color tone area and a second color tone area in which the first color tone area is provided. The second color tone area is divided into the first region, the second region, the third region, the fourth region, the fifth region and the sixth region. Outlines of the first region through the sixth region are defined by first three points of intersection on a perimeter of the second color tone area at which a triangle circumscribed outside the first color tone area intersects with the perimeter of the second color tone area and second three points of intersection on the perimeter of the second color tone area at which dividing lines that pass through the first three points of intersection and a center of the second color tone area intersect with the perimeter of the second color tone area.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
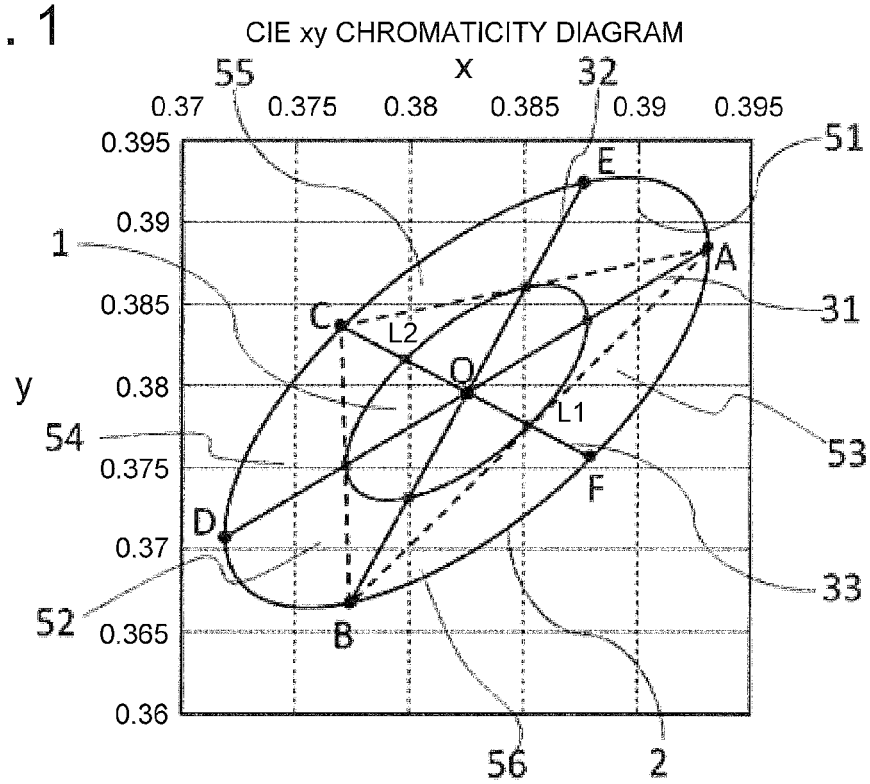
FIG. 1 is an abbreviated diagram illustrating a method of binning light emitting devices for the first embodiment of the present invention.

The embodiments will now be described with reference to the accompanying drawings, wherein like reference numerals designate corresponding or identical elements throughout the various drawings.

The following describes embodiments of the method of binning (classifying) light emitting devices, method of manufacturing an illumination device, illumination device, and illumination device manufacturing system of the present disclosure with reference to the figures.

For illustrative purposes, the drawings may have color sorting regions or light emitting device constituent elements exaggerated in part or in entirety. In addition, for clarity, even when a figure illustrates a cross-section, the cross-section region may not be designated with oblique cross-hatching.

An embodiment of a method of manufacturing an illumination device may include: determining a color tone of a plurality of light emitting devices having different color tones; and binning the light emitting devices into a first color tone area, a first region, a second region, a third region, a fourth region, a fifth region, and a sixth region depending on the determined color tone of each of the light emitting device, the first color tone area being set on a chromaticity diagram and a second color tone area that is outside the first color tone area being set on the chromaticity diagram in which the second color tone area being further divided into the first region through sixth region.

According to another embodiment of a method of manufacturing an illumination device, the first region through sixth region may be divided into pairs: the first region and the second region, the third region and the fourth region, and the fifth region and the sixth region, such that each region is positioned opposite its paired region on the other side of the first color tone area.

According to another embodiment of a method of manufacturing an illumination device, it may further includes mounting at least one first light emitting device which is binned in the first region, and at least one second light emitting device which is binned in the second region, with disposition that merges and mixes light output from each of the light emitting devices.

According to another embodiment of a method of manufacturing an illumination device, it may further includes mounting at least one third light emitting device which is binned in the third region, and at least one fourth light emitting device which is binned in the fourth region, with disposition that merges and mixes light output from each of the light emitting devices.

According to another embodiment of a method of manufacturing an illumination device, it may further includes mounting at least one fifth light emitting device which is binned in the fifth region, and at least one sixth light emitting device which is binned in the sixth region, with disposition that merges and mixes light output from each of the light emitting devices.

According to another embodiment of a method of manufacturing an illumination device, the first region through sixth region are regions defined by: vertices A, B, C of a triangle that inscribes the first color tone area and is inscribed inside the second color tone area, which is concentric with the first color tone area, and dividing lines AD, BE, CF that pass through the center O of the second color tone area and divide the second color tone area into six regions.

According to another embodiment of a method of manufacturing an illumination device, the first region through sixth region are regions defined by: vertices A, B, C of a triangle that is inscribed inside the second color tone area and has sides that intersect with the perimeter of the first color tone area at three or more points, and dividing lines AD, BE, CF that pass through the center O of the second color tone area and divide the second color tone area into six regions.

According to another embodiment of a method of manufacturing an illumination device, two of the dividing lines extend in the long direction of the second color tone area.

According to another embodiment of a method of manufacturing an illumination device, the first color tone area and the second color tone area have elliptical shapes.

According to another embodiment of a method of manufacturing an illumination device, the first color tone area is a 3-step MacAdam ellipse.

According to another embodiment of a method of manufacturing an illumination device, the chromaticity diagram is a CIE x, y chromaticity diagram or a CIE LUV chromaticity diagram.

According to another embodiment of a method of manufacturing an illumination device, light output from each of the light emitting devices is merged and mixed to output white-light, and the center of the first color tone area is positioned on or along the black-body locus, or towards the x-axis from the black-body locus.

According to another embodiment of a method of manufacturing an illumination device, reference chromaticity data for sorting is stored in memory, the reference chromaticity data being the range set on a chromaticity diagram as the first color tone area and the second color tone area, which is outside the first color tone area, the second color tone area being divided into the first region, second region, third region, fourth region, fifth region, and sixth region, and the first region and second region, the third region and fourth region, and the fifth region and sixth region being paired off to sandwich the first color tone area between the two regions of each pair, binning the light emitting devices into a first color tone area, a first region, a second region, a third region, a fourth region, a fifth region, and a sixth region depending on the determined color tone of each of the light emitting device, the first color tone area being set on a chromaticity diagram and a second color tone area that is outside the first color tone area being set on the chromaticity diagram in which the second color tone area being further divided into the first region through sixth region, in binning the light emitting devices, the reference chromaticity data sorted in memory is referred to determine each light emitting device belongs to which of the first color tone region, and first through sixth regions based on the color tone determined, and based on those determinations, dispatch each light emitting device into one of a first color tone bin, first bin, second bin, third bin, fourth bin, fifth bin and sixth bin, each of which corresponds to the first color tone area, first through the sixth regions and the first light emitting devices from the first bin and second light emitting devices from the second bin are extracted and mounted on a circuit board with disposition that results in merging and color-mixing the light output from each light emitting device.

According to another embodiment of a method of manufacturing an illumination device, in determining which region each light emitting device belongs to, if the light emitting device is determined not belonging to any of the first color tone area, first through sixth regions, that light emitting device is dispatched into a seventh bin.

According to another embodiment of a method of manufacturing an illumination device, the light emitting devices are light emitting diodes.

According to another embodiment of an illumination device manufacturing system, it includes: memory to store as a reference chromaticity data, the range of chromaticity for color tone sorting as a first color tone area and a second color tone area, which is outside the first color tone area, the second color tone area is divided into a first region, second region, third region, fourth region, fifth region, and sixth region, and the first region and second region, the third region and fourth region, and the fifth region and sixth region are paired off to sandwich the first color tone area between the two regions of each pair; a first color tone bin, first bin, second bin, third bin, fourth bin, fifth bin, and sixth bin established to correspond to each of the first color tone area, and first through sixth regions; a color tone determining section to determine the color tone of each of the plurality of different color tone light emitting devices; a binning section to determine which of the first color tone area, and first through sixth regions each light emitting device belongs to based on the color tone determined in the color tone determining section with reference to the reference chromaticity data stored in the memory, and based on those determinations, dispatch each light emitting device into one of the first color tone bin and first through sixth bins; and a mounting section to extract from the plurality of light emitting devices binned in the first color tone bin, and first bin through the sixth bin, first light emitting devices from the first bin and second light emitting devices from the second bin, and mount the extracted first light emitting devices and second light emitting devices on a circuit board with disposition that results in merging and color-mixing the light output from each light emitting device.

According to another embodiment of a method of binning light emitting devices, the method including: determining a color tone of a plurality of light emitting devices having different color tones; and binning the light emitting devices into a first color tone area, a first region, a second region, a third region, a fourth region, a fifth region, and a sixth region depending on the determined color tone of each of the light emitting device, the first color tone area being set on a chromaticity diagram and a second color tone area that is outside the first color tone area being set on the chromaticity diagram in which the second color tone area being further divided into the first region through sixth region.

According to another embodiment of a method of binning light emitting devices, the first region through sixth region are divided into pairs: the first region and the second region, the third region and the fourth region, and the fifth region and the sixth region, such that each region is positioned opposite its paired region on the other side of the first color tone area.

According to another embodiment of a method of binning light emitting devices, the first region through sixth region are regions defined by: vertices A, B, C of a triangle that inscribes the first color tone area and is inscribed inside the second color tone area, which is concentric with the first color tone area, and dividing lines AD, BE, CF that pass through the center O of the second color tone area and divide the second color tone area into six regions.

According to another embodiment of a method of binning light emitting devices, the first region through sixth region are regions defined by: vertices A, B, C of a triangle that is inscribed inside the second color tone area and has sides that intersect with the perimeter of the first color tone area at three or more points, and dividing lines AD, BE, CF that pass through the center O of the second color tone area and divide the second color tone area into six regions.

According to another embodiment of a method of binning light emitting devices, two of the dividing lines extend in the long direction of the second color tone area.

According to another embodiment of a method of binning light emitting devices, the first color tone area and the second color tone area have elliptical shapes.

According to another embodiment of a method of binning light emitting devices, the first color tone area is a 3-step MacAdam ellipse.

According to another embodiment of a method of binning light emitting devices, the chromaticity diagram is a CIE x, y chromaticity diagram or a CIE LUV chromaticity diagram.

According to another embodiment of a method of binning light emitting devices, light output from each of the light emitting devices is merged and mixed to output white-light, and the center of the first color tone area is positioned on or along the black-body locus, or towards the x-axis from the black-body locus.

According to another embodiment of a method of binning light emitting devices, the light emitting devices are light emitting diodes.

First Embodiment

First, the method of binning light emitting devices for the first embodiment of the present embodiment is described using FIG. 1. As shown in FIG. 1, a first color tone area 1 is defined in a given region of the CIE 1931 standard chromaticity diagram, which has x and y as horizontal and vertical axes (where x and y chromaticity coordinates are computed from the light power spectrum and spectral distribution coefficients). This first color tone area 1 is the desired color tone region for a light emitting device or for an illumination device that uses a plurality of light emitting devices. The first color tone area 1 for the first embodiment is essentially coincident with a 2.5-step MacAdam ellipse centered at the x, y coordinates 0.3825, 0.3796 on the chromaticity diagram.

The outline of the first color tone area 1 is preferably a shape such as an ellipse (which is long in one direction and short in the other direction) or a polygon with long and short directions. Further, it is desirable for the long direction to incline and align with the scatter in the light emitting device population due to process variation. This allows the number of light emitting devices selected within the first color tone area 1 to be increased (increasing light emitting device yield in the first color tone area). As shown in FIG. 1, it is further desirable for the first color tone area 1 to be an ellipse.

The location and size of the first color tone area defines a region (of color space) where all the light emitting devices binned in that first color tone area have the stipulated (targeted) color tone. For example, in the case of a light source for general lighting applications, it is desirable for the first color tone area to be included inside one ANSI standard chromaticity region (quadrilateral). Further, it is desirable for the first color tone area to match or reside inside a MacAdam ellipse, such as inside a 3-step MacAdam ellipse, centered at a specific chromaticity. It is even more desirable for the first color tone area to reside inside a 3-step MacAdam ellipse that lies inside a targeted color tone region such as inside one ANSI standard chromaticity region. Under the above circumstance, by using only light emitting devices binned in such first color tone area (without mixing or mounting any light emitting devices binned in other color tone regions), illumination devices can be manufactured that all conform to the various standards and/or appear to the human eye as the same color.

The center of the first color tone area can be at or in the vicinity of the following chromaticity coordinates: (x,y=0.4578, 0.4101), (x,y=0.4338, 0.4030), (x,y=0.4073, 0.3917), (x,y=0.3818, 0.3797), (x,y=0.3611, 0.3658), (x,y=0.3447, 0.3553), (x,y=0.3287, 0.3417), or (x,y=0.3123, 0.3282).

It should be mentioned that the interior of a 3-step MacAdam ellipse ranges means within three standard deviations of color matching (SDMC). A MacAdam ellipse is the region of color space on a CIE standard chromaticity diagram with an outline that the human eye perceives as equidistant from a standard color tone. The MacAdam ellipse step size is the number of SDMC. Said differently, the color tone of light produced by a light emitting device or illumination device with chromaticity coordinates inside a 3-step MacAdam ellipse does not vary more than three SDMC from a given color.

MacAdam ellipses and SDMC are described in detail in references such as: MacAdam D. L., "Specification of Small Chromaticity Differences," *Journal of the Optical society of America*, Vol. 33, No. 1, January 1943, pp. 18-26.

In case where the light emitting device or illumination device is one that emits white-light, it is preferable for the first color tone area, and in particular in case where the perimeter of first color tone area is the MacAdam ellipse, to be centered along the black-body locus or slightly offset from the black-body locus towards the x-axis (away from green color tones). This makes it possible to manufacture high-quality illumination apparatus for general lighting applications.

In case where the perimeter of the first color tone area is effectively coincident with a MacAdam ellipse, it is preferable for the ellipse to be a 3-step or smaller MacAdam ellipse, and more preferably for the ellipse to be a 2.5-step or ≤2-step MacAdam ellipse. With these size MacAdam ellipses, and in particular with a 2-step or smaller MacAdam ellipse, an extremely high-quality illumination device can be provided in which virtually no color variation can be perceived by the human eye.

The size of the first color tone area can also be set, for example, by production yield of light emitting devices. The first color tone area 1 can be set to a region that encompasses the chromaticity of ≥50%, ≥75%, or ≥80% of the light emitting devices manufactured.

The second color tone area 2 is a region of color-space outside the first color tone area 1. The second color tone area 2 of the present embodiment has the outline of an ellipse that is larger than that of the first color tone area and specifically has the outline of 6-step MacAdam ellipse.

The second color tone area 2 can have an arbitrary size and shape as long as it lies outside the first color tone area 1. Specifically, the second color tone area 2 is formed as an annular shape that surrounds the first color tone area 1.

Figure 2:
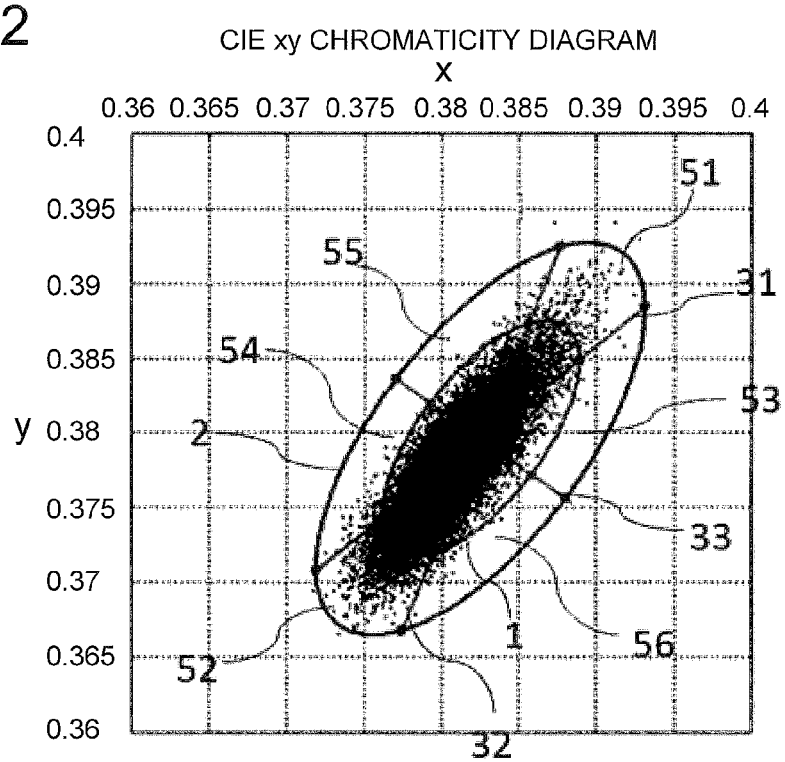
FIG. 2 is a graph showing the distribution of light emitting device chromaticity on a chromaticity diagram.

The outline of the second color tone area 2 is preferably a shape such as an ellipse (which is long in one direction and short in the other direction) or a polygon with long and short directions. In particular, an ellipse is the desired shape of the second color tone area 2. As shown by the distribution of data points in FIG. 2, chromaticity variation results when light emitting devices are manufactured using light emitting elements and phosphor (or fluorescent material) that absorbs light from the light emitting element and re-emits light at a different wavelength. As shown in FIG. 2, the distribution of data points on the chromaticity diagram takes on an approximately elliptical shape with a major axis inclined in the direction of lines between points corresponding to the wavelength of light emitted from the light emitting elements and points corresponding to the peak wavelength of the wavelength-conversion material (phosphor). Accordingly, by setting the second color tone area 2 along the distribution due to process variation, it is possible to bin light emitting devices and utilize them in illumination devices without (reject) waste. Further, by setting the inclination of the second color tone area ellipse approaching the inclination of the process variation ellipse, the number of light emitting devices binned in the second color tone area can approach the number binned in the first color tone area. This simplifies resourceful use light emitting devices without waste.

The second color tone area 2 preferably has a shape similar to that of the first color tone area 1. For example, when the first color tone area 1 has an elliptical shape, it is desirable for the second color tone area 2 to have an elliptical shape.

As shown in FIG. 1, the second color tone area 2 is divided into six regions, which are a first region 51 through sixth region 56. Light emitting devices for the first embodiment are binned by chromaticity in seven binning (selection) regions, which are the first region 51 through sixth region 56 (at least six regions) of the color tone area, and the first color tone area 1.

The first region 51 is located opposite the second region 52 with the first color tone area 1 and center O of the second color tone area 2 intervening in between. The third region 53 is located opposite the fourth region 54 with the first color tone area 1 and center O of the second color tone area 2 intervening in between. The fifth region 55 is located opposite the sixth region 56 with the first color tone area 1 and center O of the second color tone area 2 intervening in between.

In the present embodiment, the first region 51 through sixth region 56 have shapes similar to pieces of an elliptical sector with vertices truncated along arcs on the perimeter of the first color tone area. The outline of the six regions are established by lines 31. 32, 33 that intersect with the perimeter of the second color tone area 2 at three points D, E, F, pass through the center O of the second color tone area 2, and intersect with the perimeter of the second color tone area 2 at three other points A, B, C, which are the vertices of a triangle (broken line in FIG. 1) inscribed inside the second color tone area 2 with sides that contact the perimeter of the first color tone area 1. Specifically, the outlines of the first region 51 through sixth region 56 include lines that connect to six intersection points on the perimeter and pass through the center O of the second color tone area.

More specifically, the first region 51 is defined by an arc on the perimeter of the first color tone area 1, the first line 31 that passes through the center O of the second color tone area 2 and intersects with the perimeter of the second color tone area 2 at the first vertex A of the triangle ABC (that circumscribes the first color tone area 1), the second line 32 that intersects with the perimeter of the second color tone area 2 at the second vertex B of the triangle and passes through the center O of the second color tone area 2, and the arc on the perimeter of the second color tone area 2 between the intersection point E of the second line 32 with the perimeter of the second color tone area 2 and the first vertex point A.

In the present specification, the lines 31, 32, 33 that pass through the center O of the second color tone area 2 and intersect with the perimeter of the second color tone area 2 at the vertices A, B, C of the triangle, ABC which circumscribes the perimeter of the first color tone area 1, are also called the dividing lines.

Although the present embodiment locates the dividing lines 31, 32, 33 with respect to a triangle with vertices at points A, B, C, the triangle may have an alternate disposition. For example, the triangle may have its vertices at points D, E, F.

In the present embodiment, it is desirable for two of the dividing lines to be established extending in the long direction of the second color tone area. In particular, two of the dividing lines are preferably disposed to scissor the major axis of the elliptical second color tone area in between. This allows opposing binning regions to be approximately symmetrical, makes it possible to bin approximately the same number of light emitting devices in the opposing regions, and enables utilization of processed light emitting device without waste.

The ellipse inscribed inside the triangle indicates the range of color tone obtained by mixing light from light emitting devices binned in the opposing regions of the first through sixth regions. Specifically, when light emitting devices from the first and second regions, the third and fourth regions, or the fifth and sixth regions are used in combination, it is possible to obtain illumination device combined light emission that has color tone within the ellipse inscribed inside the triangle. Namely, by establishing this type of triangle that contacts the perimeter of the targeted color tone area (in other words, the first color area 1), binning regions can be set to avoid wasting devices (described in detail later).

Binning region divisions can be set by dividing the second color tone area 2 (outside the first color tone area 1) into six regions referenced to an inscribed triangle such that combined light from light emitting devices binned in two of the six regions produces a color tone in the first color tone area.

The method of binning light emitting devices by color tone can be a method that bins light emitting devices according to the first color tone area and the second color tone area (outside the first color tone area), where the second color tone area is divided into a first through sixth binning region. The outlines of the first through sixth binning regions are fixed by the three vertices of a triangle, which is inscribed inside the second color tone area and intersects with the first color tone area at three points or more, and three points on the perimeter of the second color tone area that intersect with dividing lines that pass through the three vertex points of the triangle and the center of the second color tone area.

Second Embodiment

Figure 3:
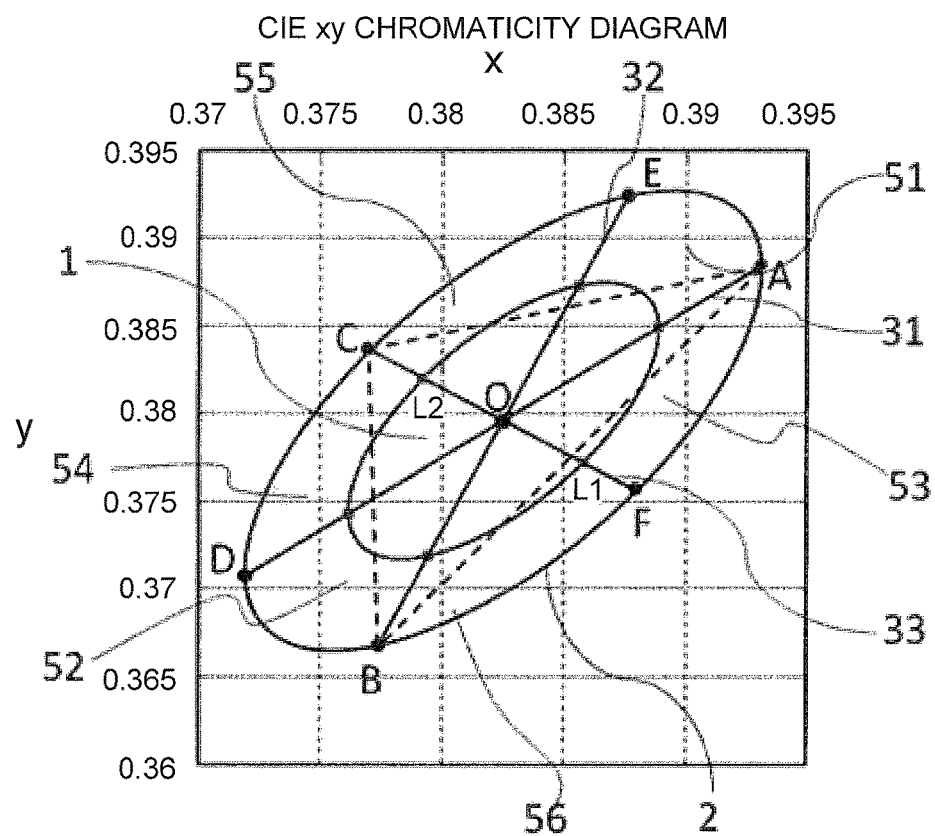
FIG. 3 is an abbreviated diagram illustrating a method of binning light emitting devices for the second embodiment of the present invention.

For example, at least one side of the triangle may intersect with the outline of the first color tone area at two points. As shown in FIG. 3, when the first color tone area is established as a 3-step MacAdam ellipse and the second color tone area as a 5-step MacAdam ellipse, a triangle inscribed inside the second color tone area is smaller than one that inscribes the first color tone area and each side intersects with the perimeter of the first color tone area at two points. When the first color tone area 1, second color tone area 2, and first region 51 through sixth region 56 are set in this manner, light from an illumination device using devices binned in the second color tone area 2 will be inside the first color tone area 1 and inward from its boundary with the second color tone area 2. This allows manufacture of illumination devices that emit light of the targeted color tone even when sorting (binning) accuracy is not very high. For example, if light emitting devices binning is not highly accuracy (relatively large sorting error), the error can be absorbed and the targeted color can still be achieved. The size of the (reference) triangle can be suitably chosen depending on binning accuracy and the required quality of the illumination device. However, if the triangle is too small, namely if the second color tone area is small, the color tone area for usable light emitting devices becomes small. In this respect, it is desirable for the triangle to inscribe (have sides tangent to) the first color tone area and be inscribed inside the second color tone area, as shown in FIG. 1. This allows light emitting device binning to minimize wasted (reject) devices.

Note, in the present application, terms such as "inscribed," "inscribed inside," "centered at," "through the center," and "inside a region" do not necessarily have the meaning associated with narrow definition, and can include wider meanings accepted as essentially the same in practice. The range of meaning can also include deviation or error such as that due to variation in device measurement and processing tool settings.

The first color tone area 1, the second color tone area 2, and the first region 51 through the sixth region 56 can be established by any arbitrary method as long as it does not deviate from the intent implied by previous description. There is no particular requirement to initially establish a triangle, and the dividing lines 31, 32, 33 may be generated based on computation alone. For example, two concentric circles can be established with three lines angularly separated by 60° passing through the common center point, the eccentricity of the circles can be increased while inclining the major axis, those inner and outer ellipses overlaid on a chromaticity diagram can be designated as the first color tone area 1 and the second color tone area 2 with the three lines forming the dividing lines 31, 32, 33.

Light emitting devices are binned (sorted) according to the binning regions described above. The light emitting devices can be binned by accepted (well-known within the industry) binning methods. For example, the binning process can supply power to a light emitting device by contacting measurement equipment probes to the positive and negative electrodes of the device, and the color tone of light emitted from the device can be measured.

In this manner, a plurality of light emitting devices are binned in the first color tone area 1, first region 51 through sixth region 56. The binned light emitting device is kept as either group of the first color tone area 1, first region 51 through sixth region 56, respectively. For example, each light emitting device is sorted into container, bin or bag corresponding to the first color tone area 1, first through sixth regions. By mounting light emitting devices, which are binned in this manner, according to the mounting method described below, an illumination device can be manufactured that emits light having color tone within the first color tone area. The bins can be cylindrical containers, boxes, or trays divided into a plurality of sections, e.g. Depending on requirements, light emitting devices sorted into these types of bins can be bagged or transferred into other types of containers.

A method of mounting is descried for the case where light emitting devices binned in the first region 51 (FIG. 1) and in the second region 52, which is opposite the first region 51 on the other side of the first color tone area 1, are mounted in an illumination device.

When the light flux of each light emitting device is the same, mounting a light emitting device with chromaticity at the boundary point A of the first region 51 and a light emitting device with chromaticity at the boundary point B of the second region 52 results in an illumination device that produces light with a chromaticity at the tangent point L1 of the triangle with the perimeter of the first color tone area 1. Similarly, an illumination device using light emitting devices with chromaticity at boundary points E and D produces light with a chromaticity at point L2 on the perimeter of the first color tone area 1.

Specifically, if the amount of light emitted from light emitting devices binned in the first region 51 and second region 52 is the same (if the light flux and number of devices is the same), the color tone of the resulting illumination device will be on the perimeter or inside the first color tone area 1 even when the most boundary-case devices are mounted, and the targeted color tone can be achieved. It should be mentioned that in actual light emitting device manufacture, the number of devices with chromaticity on the boundary of a binning region may not be large, and in practice the chromaticity of resulting illumination devices is inward from the perimeter of the first color tone area.

In this manner, an illumination device that emits light having the chromaticity of the first color tone area 1 can be manufactured efficiently using light emitting devices that emit light within a wider range of chromaticity (outside the first color tone area).

Establishing fine subdivisions of light emitting device color tone binning regions may increase cost and lower yield. However, with the binning method of the present embodiment, binned light emitting devices can be utilized without waste, and illumination devices with the targeted color tone can be produced. Further, the number of light emitting devices rejected for emission with chromaticity outside the targeted range can be reduced.

Although an example of light emitting devices binned in the first region 51 and in the second region 52 is described here, light emitting devices, i.e., third light emitting devices 10c and fourth light emitting devices 10d respectively binned in the third region 53 and in the fourth region 54 (which is opposite the third region 53 on the other side of the first color tone area 1), or light emitting devices, i.e., fifth light emitting devices 10e and sixth light emitting devices 10f respectively binned in the fifth region 55 and in the sixth region 56 (which is opposite the fifth region 55 on the other side of the first color tone area 1) can also be used in illumination devices that emit light with color tone in the first color tone area 1. Further, it should be noted that first color tone area light emitting device 10o which are binned in the first color tone area 1 need not to combine other light emitting devices binned in other area, but are employed alone to achieve illumination device outputting desired color tone light.

The method of mounting light emitting devices preferably alternately mounts light emitting devices binned in different regions one by one or group by group (for a plurality of devices). When devices are mounted in a plurality of rows, it is desirable for light emitting devices binned in one region to be adjacent to light emitting devices binned in a different region. This can increase color mixing of light emitted by devices binned in different regions, and can produce light with approximately uniform color over the entire light emitting area of the illumination device.

(Light Emitting Device)

Figure 4:
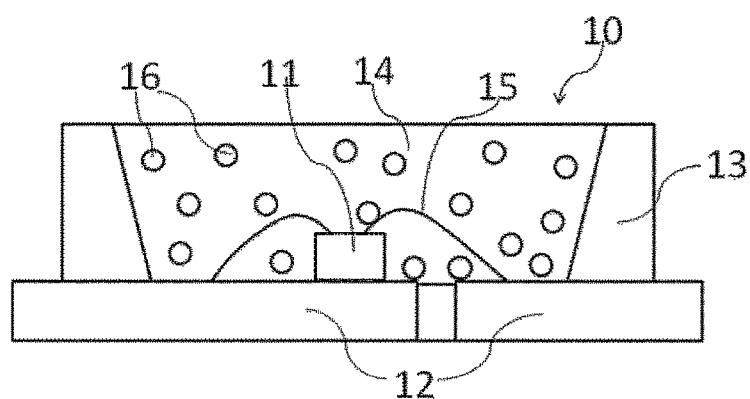
FIG. 4 is a schematic cross-section drawing showing a light emitting device for an embodiment of the present invention.

A cross-section drawing of one example of a light emitting device suitable for use in the present embodiment is shown in FIG. 4. For example, the light emitting device 10 has a light emitting element 11 mounted inside a recess in the package 13, and has light transmitting encapsulating material 14 encasing the light emitting element 11. The light emitting element 11 and positive and negative electrodes 12 (leads) exposed from the bottom of the package are electrically connected via two bonding wires 15. Further, the light transmitting encapsulating material 14 contains phosphor 16.

Devices such as a surface mounted type light emitting diode (LED), which houses the light emitting element inside a package provided with positive and negative electrodes and reflecting material etc., a domed-top (lamp type) LED, and a chip-scale package LED, which has resin material and phosphor etc. integrally formed around the light emitting element, can be used as light emitting devices.

The light emitting element has, for example, a p-type semiconductor layer, an active region that emits light, an n-type semiconductor layer, a p-side electrode electrically connected to the p-type semiconductor layer, and an n-side electrode electrically connected to the n-type semiconductor layer. Electrodes of light emitting element are electrically connected to (package) lead electrodes by techniques such as die-bonding, wire-bonding, or flip-chip bonding. Electrodes of light emitting element can also be exposed outside the light emitting device as lead electrodes for surface-mount connection to a circuit board.

The emission wavelength and material used for a light emitting element can be, for example, in the case of a blue or violet light emitting element, GaN-based semiconductor material deposited on a sapphire substrate. This light emitting element can be combined with phosphor (described below) to manufacture a white-light emitting device in a straight-forward manner.

(Phosphor)

The light emitting device may not only include a light emitting element, but may also include phosphor (or fluorescent material) that absorbs the emitted light and re-emits it at a different wavelength. This makes the light emitted from a light emitting device a combination of light emission from the light emitting element and from the phosphor.

Phosphor can be disposed in the light emitting device by various methods. For example, phosphor can be mixed into the light transmitting encapsulating material that surrounds the light emitting element, or it can be disposed above the light emitting element in sheet-like form.

Various materials that can absorb light emitted from a light emitting element and re-emit light at a different wavelength can be used as the phosphor. For example, the phosphor can be nitride and oxy-nitride system phosphors primarily activated by lanthanoid-group elements such as europium and cerium. More specifically, the phosphor can be substances such as europium-activated α or β-sialon (β-SiAlON) phosphor, various alkaline earth metal nitride silicate phosphors, lanthanoid-group elements such as europium, alkaline earth metal halogen-apatite phosphors primarily activated by transition metal group elements such as manganese, alkaline earth halo-silicate phosphors, alkaline earth metal silicate phosphors, alkaline earth metal halogen borate phosphors, alkaline earth metal aluminate phosphors, alkaline earth metal silicates, alkaline earth metal sulfides, alkaline earth metal thiogallates, alkaline earth metal silicon nitride, germinate, rare earth element aluminates primarily activated by lanthanoid-group elements such as cerium, and organic and organic complex materials primarily activated by rare earth element silicates or lanthanoid-group elements such as europium. In particular, for the case of use in combination with a blue light emitting element, yellow fluorescing yttrium-aluminum-garnet ($Y_3Al_5O_{12}$: YAG) based phosphor, red fluorescing $CaAlSiN_3$ (CASN) and $K_2SiF_6$ (KSF), and green fluorescing β-SiAlON and lutetium-aluminum-garnet ($Al_5Lu_3O_{12}$: LAG) can be with good results. This allows manufacture of light emitting devices with color tone from white to incandescent light.

It is possible to use two or more types of phosphor in a single light emitting device. Two or more phosphor types can be used by mixing them together or by disposing them in layers.

Color variation for light emitting devices using two or more types of phosphor, which fluoresce with different colors, is greater than that for devices using a single type of phosphor. For example, a light emitting device that emits white-light can be manufactured using a blue light emitting element and two types of phosphor that absorb blue light and re-emit green and red light respectively. In that case, variation in phosphor quantity or mixing ratio results in light emitting devices with color tone having a wide distribution in two directions in color space (in the green y-direction and red x-direction on the chromaticity diagram). Namely, the range of light emitting device color tone variation is greater than that for the case of a single type of phosphor. However, even for this case of wider color tone variation, illumination devices that produce the desired color tone can be manufactured and cost reduced by implementing the color tone binning method of the present embodiment.

Also in the case of phosphor color variation that extends in two directions, it can be difficult to fit the light emitting device color tone distribution to the slope and shape of the black-body locus or MacAdam ellipse. Consequently, there may be a tendency for number of light emitting devices binned in the first color tone area 1 to decrease and reduce yield. However, in the present embodiment, light emitting devices are used that have color tone in the second color tone area 2, which is outside the first color tone area 1, and illumination devices can be manufactured with the desired color tone while reducing illumination device manufacturing and color tone binning costs.

For the same reasons described above, color tone variation is also increased when different types of phosphor are formed in layers. In this case as well, application of the methods of the present embodiment has similar advantageous results.

In addition, the light emitting device can carry a plurality of light emitting elements that emit different colors without including phosphor. Devices that carry a plurality of different color light emitting elements and include phosphor are also possible. Specifically, a light emitting device using a blue light emitting element and phosphor that absorbs blue light and re-emits green light can produce a light-green (whitish green) color. Light from that device can be merged with light from a red light emitting element or a light emitting device that includes a red light emitting element to make a light emitting device that produces light within the white-light region of color space. In this case, light emitting device color tone binning can be performed at the light-green stage, or after merging with light from red light emitting elements.

Variation (dispersion) in light emitting device color tone has various causes. For example, there can be variation in phosphor quantity and distribution, light emitting element emission wavelength, phosphor mixing ratio, viscosity of the resin that includes phosphor, and in the run-time wear or various manufacturing and measurement equipment.

(Illumination Device)

Figure 5:
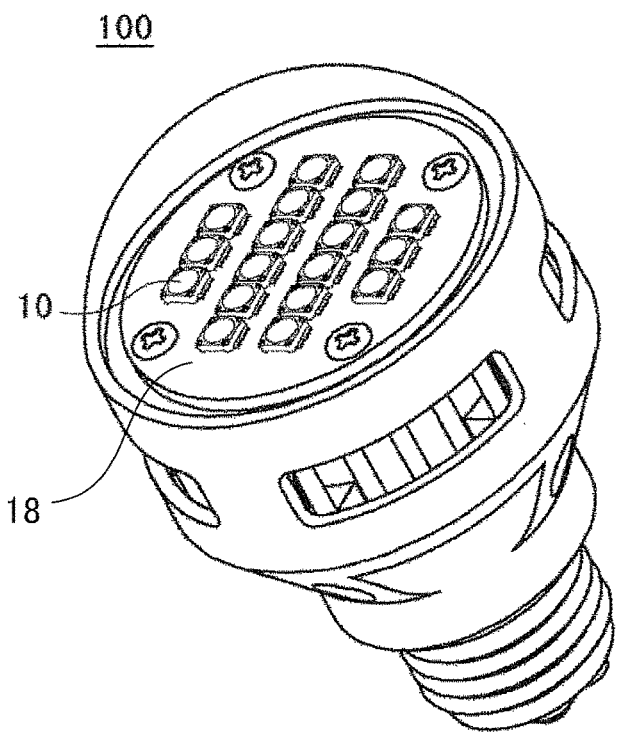
FIG. 5 is a schematic drawing showing an illumination device for an embodiment of the present invention.

The illumination device for the present embodiment can be any type of lighting device. For example, the illumination device can be backlight for equipment such as a television set or smart phone, a light-bulb shaped light (as shown in FIG. 5 for example), fluorescent light shaped lighting, recessed troffer fixture lighting, spotlight lighting, linear fixture lighting, street lighting, an automotive headlight, or a flashlight. The light-bulb shaped illumination device 100 shown in FIG. 5 has a plurality of light emitting devices 10 surface mounted on a circuit board 18.

Light emitting device binning method and illumination device manufacturing method are described above to illustrate embodiment of the present invention. However, it should go without saying that the present invention is not limited to embodiment as described above, and based on the previous descriptions, various modifications or improvements are also included within the intent of the present invention.

Third Embodiment

Figure 7:
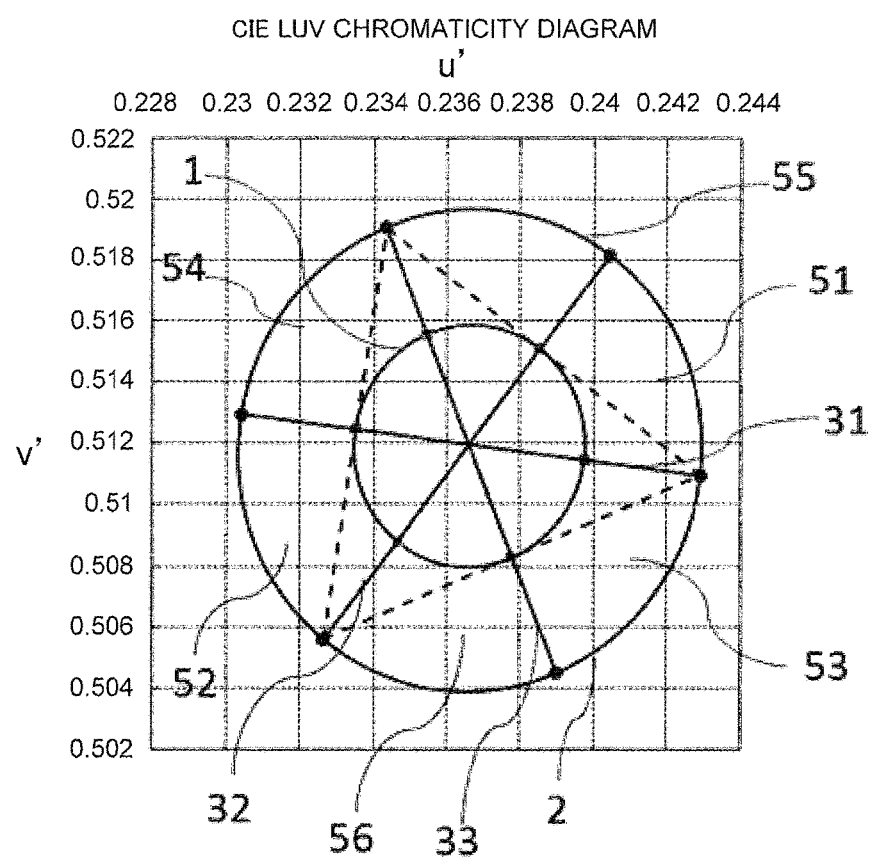
FIG. 7 is an abbreviated diagram illustrating a method of binning light emitting devices for the third embodiment of the present invention.
Figure 8:
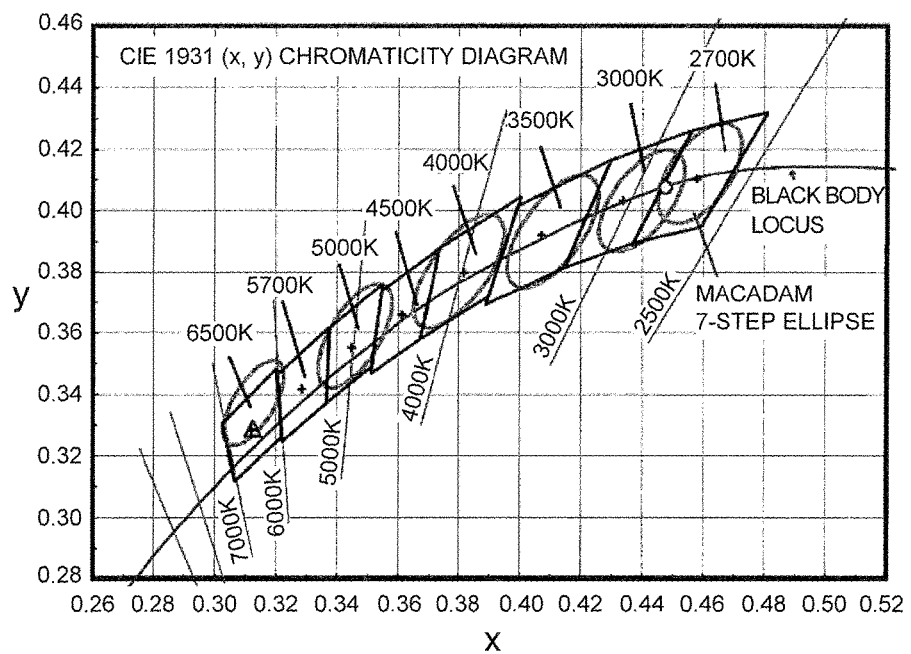
FIG. 8 is a diagram showing ANSI chromaticity regions and 7-step MacAdam ellipses on a CIE 1931 (x, y) chromaticity diagram.
Figure 9:
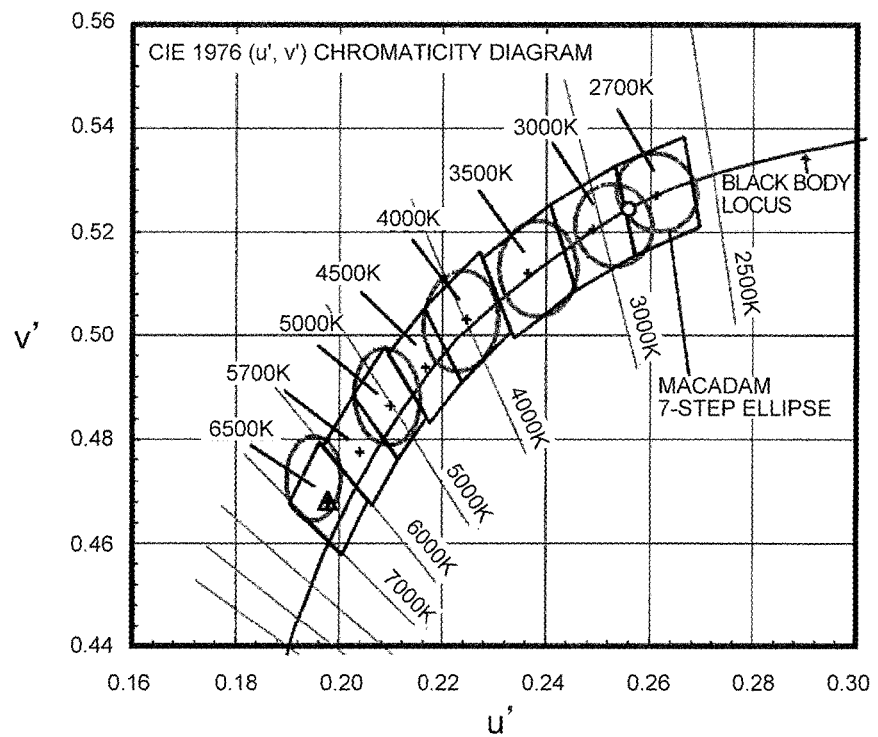
FIG. 9 is a diagram showing ANSI chromaticity regions and 7-step MacAdam ellipses on a CIE 1976 (u', v') chromaticity diagram.

For example, although previous description is based on the CIE 1931 standard chromaticity diagram, the present embodiment can also be applied in the case of other chromaticity diagram formats. For example, the present embodiment can be applied as well to the u', v' coordinate chromaticity diagram (CIE 1976 or CIELUV color space) shown in FIG. 7. Here, the first color tone area 1 essentially coincides with a 3-step MacAdam ellipse (in the same manner as in the second embodiment), and the second color tone area 2 is divided by three dividing lines 31, 32, 33 into six binning regions, which are the first region 51 through the sixth region 56.

Further, there is no requirement for light emitting device binning to be implemented only once. After sorting devices into bins that are finer than the six regions, devices from a plurality of regions can be combined and used as one wider region. Conversely, after initial binning into wide regions, devices can be re-sorted into narrower regions.

Light emitting devices binned into three or more regions can be used in producing the illumination device.

Fourth Embodiment

Figure 6:
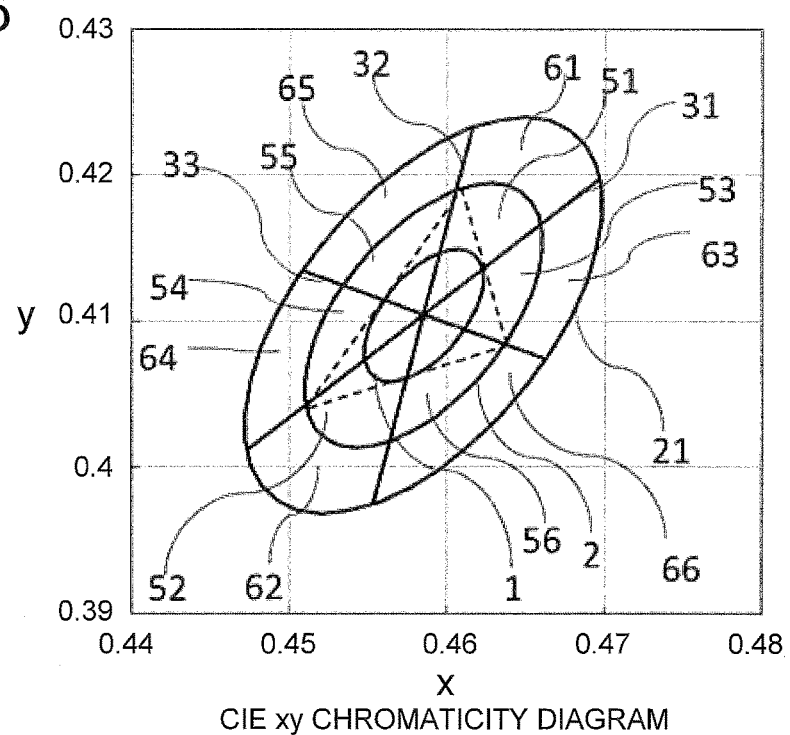
FIG. 6 is an abbreviated diagram illustrating a method of binning light emitting devices for the fourth embodiment of the present invention.

Further, as shown in FIG. 6, a third color tone area 21, which is larger than the second color tone area 2 can also be established. Here, the third color tone area 21 can be divided into regions by extending the dividing lines 31, 32, 33 set to divide the second color tone area 2. According to an example shown in FIG. 6, the second color tone area 2 is divided into six regions of the first through sixth regions 51 to 56, and the third color tone area 21 is also divided into six regions of a first region 61, second region 62, third region 63, fourth region 64, fifth region 65, and sixth region 66 by the dividing lines 31, 32 and 33 in the same manner as the second color tone area 2 setting the first through sixth regions 51 to 56.

(Illumination Device Manufacturing System 1000)

Figure 12:
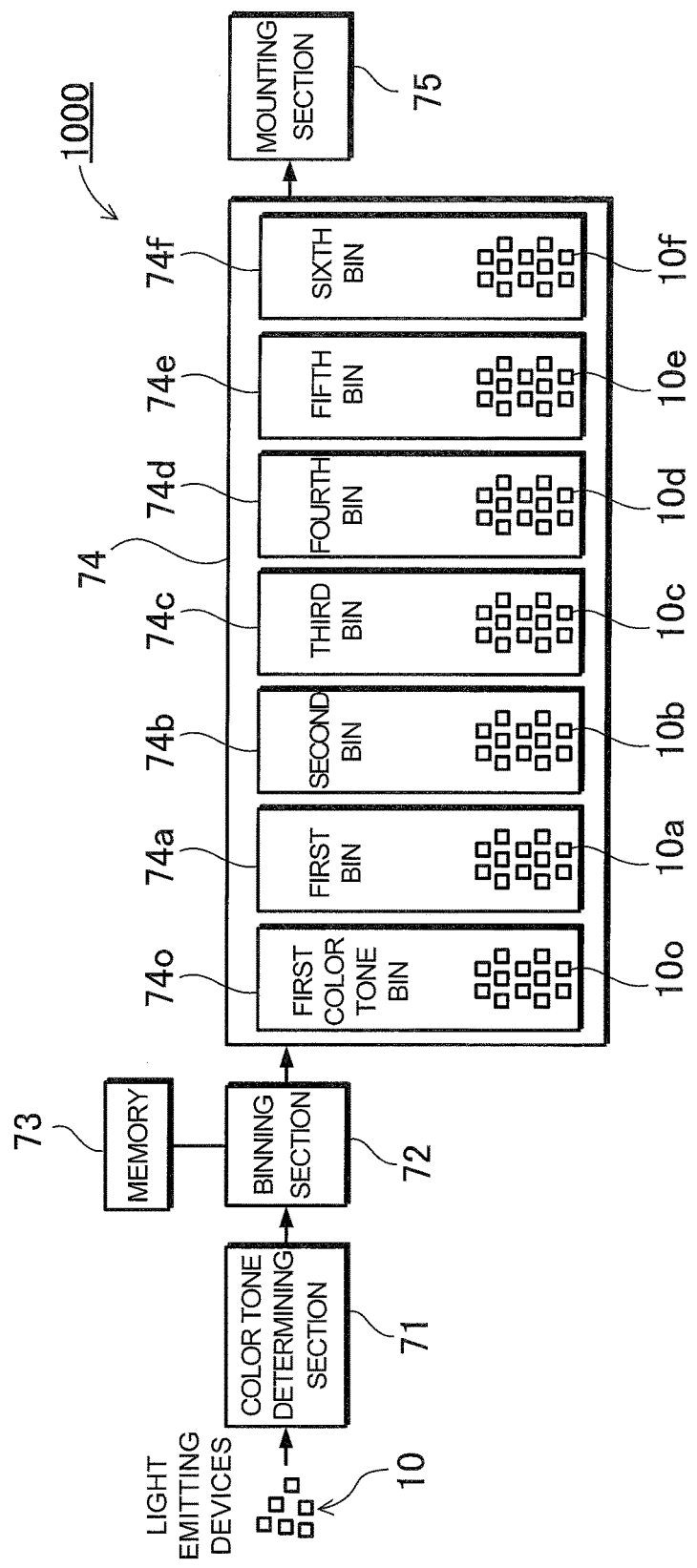
FIG. 12 is a block diagram illustrating the illumination device manufacturing system.

FIG. 12 shows an illumination device manufacturing system 1000 for another embodiment. The illumination device manufacturing system 1000 shown in this figure is provided with a color tone determining section 71, a binning section 72, memory 73, container bins 74, and a mounting section 75. The color tone determining section 71 includes equipment to detect the color tone of the plurality of different color tone light emitting devices. As described previously, equipment well-known in the industry is used to contact measurement probes to the positive and negative electrode (leads) of each light emitting device and supply power to activate light emission and measure color tone.

The binning section 72 includes hardware for sorting the light emitting devices 10 according to the color tone measured in the color tone determining section 71. Light emitting devices 10 sorted by color tone are retained in container bins 74. The binning section 72 is coupled with memory 73, and chromaticity reference data is pre-stored in memory 73. Chromaticity reference data includes information defining region divisions on the chromaticity diagram such as those shown in FIG. 1 (described previously). The range of chromaticity for sorting is set to the first color tone area 1 and the second color tone area 2, which is outside the first color tone area 1. The second color tone area 2 is divided into the first region 51, the second region 52, the third region 53, the fourth region 54, the fifth region 55, and the sixth region 56. Further, the first region 51 and the second region 52, the third region 53 and the fourth region 54, and the fifth region 55 and the sixth region 56 are paired off to sandwich the first color tone area 1 between the two regions of each pair.

The container bins 74 are retainers to hold light emitting devices 10 sorted by the binning section 72. A first color tone bin 74o, first bin 74a, second bin 74b, third bin 74c, fourth bin 74d, fifth bin 74e, and sixth bin 74f are prepared corresponding to each of seven regions (the first color tone area, first region through the sixth region). The first color tone bin is provided to hold light emitting devices with chromaticity within the first color tone area (within illumination device specifications). It is also possible to further divide the first bin 74a through the sixth bin 74f such that each bin has subdivisions. For example, even for light emitting devices having same color tone, they can be further sorted based on other parameter such as output or forward voltage of the device. In addition, the first color tone bin corresponding to the first color tone area may be further divided as sub-bins to sort more specifically. As such, each area or regions and bins correspond not only one-to-one respectively, but also the first bin 74a through the sixth bin 74f corresponding to the first through sixth region can be further divided. Additionally, other than such first bin 74a through the sixth bin 74f, a seventh bin can be provided to hold light emitting devices that have color tone not within any of the six regions (or inside the first color tone area). Light emitting devices binned in the seventh bin can be rejected as out-of-specification, for example. Cylindrical jars, boxes, bags, or other receptacles of arbitrary shape can be used as the container bins.

The binning section 72 determines which region (of the first through sixth regions) each light emitting device 10 belongs to based on the color tone detected by the color tone determining section 71 with reference to the reference chromaticity data stored in memory 73. Based on binning determination results, each light emitting device 10 is dispatched into one of the container bins (first bin 74a through the sixth bin 74f). Although the above-described embodiments sort light emitting devices having variety of color tones into either the first color tone bin 74o, first bin 74a, second bin 74b, third bin 74c, fourth bin 74d, fifth bin 74e, or sixth bin 74f by single sorting step, the present invention does not limited to such configuration, rather it may perform sorting step by several sub-steps. For example, it may perform initial determination to parent population of light emitting devices, whether each of which belongs to either the first color tone area 1 or second color tone area 2, then perform another determination to the initially sorted population belonging to the second color tone area 2, further belongs to either first region 51 through sixth region 56. Even such sorting or binning method to population which is already sorted or filtered thus confirmed as the second color tone 2 should be covered by the embodiment of the present invention of sorting method of light emitting device or manufacturing method of illumination device.

The mounting section 75 matches-up light emitting devices 10 held in the container bins 74 and mounts them on a circuit board for illumination device assembly. Specifically, from the plurality of light emitting devices 10 binned in the first bin 74a through the sixth bin 74f, first light emitting devices 10a from the first bin 74a and second light emitting devices 10b from the second bin 74b are extracted and mounted on a circuit board with orientation that results in merging (and color-mixing) of light output from the first light emitting devices 10a and the second light emitting devices 10b. Similarly, third light emitting devices 10c from the third bin 74c and fourth light emitting devices 10d from the fourth bin 74d are extracted and mounted on a circuit board with orientation that results in merging (and color-mixing) of light output from the third light emitting devices 10c and the fourth light emitting devices 10d. Finally, fifth light emitting devices 10e from the fifth bin 74e and sixth light emitting devices 10f from the sixth bin 74f are extracted and mounted on a circuit board with orientation that results in merging (and color-mixing) of light output from the fifth light emitting devices 10e and the sixth light emitting devices 10f. Light emitting device layout and the number of devices mounted on the circuit board are appropriately designed according to illumination device requirements such as output and lighting configuration.

Logistic flow between the measurement section 71, a binning section 72, container bins 74, and a mounting section 75 can be direct or those sections can be physically, spatially, or temporally separated. For example, light emitting devices can be first removed from the bins and bagged, and then transported to a separate assembly facility for mounting. In that case, the container bins and mounting section are in separated locations. Also, a binning section and mounting section may be provided in the separate equipment.

Figure 10:
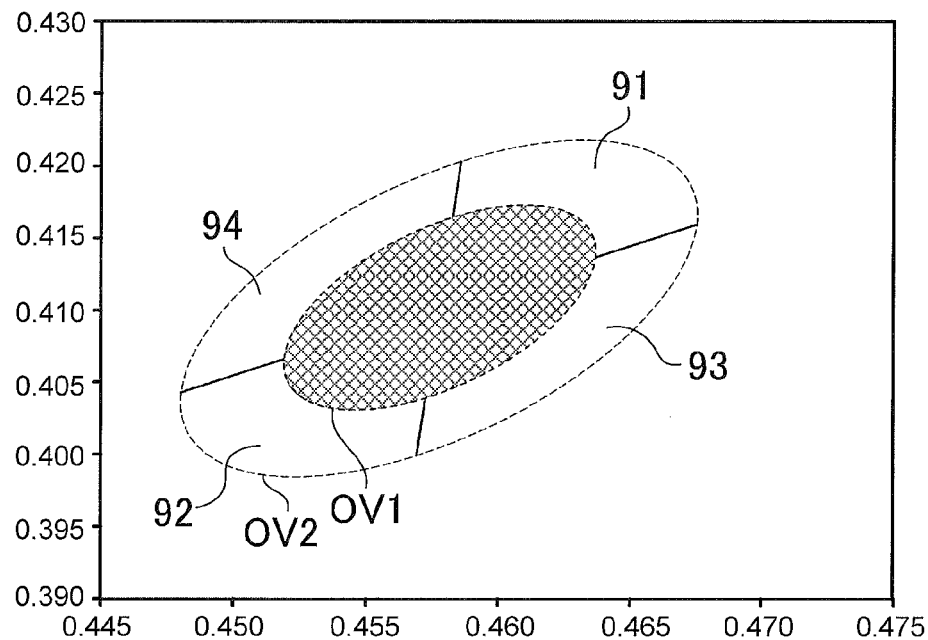
FIG. 10 is a graph showing 3-step MacAdam ellipse and 5-step MacAdam ellipse areas plotted on a CIE 1931 (x, y) standard chromaticity diagram.

The following describes one example of a technique for assembling a plurality of different color light emitting devices to obtain an illumination device that produces merged light within a targeted chromaticity range such as within a 3-step MacAdam ellipse. Turning to FIG. 10, 3-step MacAdam ellipse and 5-step MacAdam ellipse areas are shown plotted on a CIE (Commission Internationale de l'eclairage) 1931 (x, y) standard chromaticity diagram. In this figure, the inner ellipse OV1 delineates the area of a 3-step MacAdam ellipse and the outer ellipse OV2 delineates the area of a 5-step MacAdam ellipse. By plotting the chromaticity x, y coordinates for many light emitting devices on this diagram (graph), a distribution is obtained. For example, by contacting measurement probes to the positive and negative electrode (leads) of each light emitting device and supplying power, the color tone of the emitted light can be measured to obtain x, y chromaticity coordinates and establish a chromaticity distribution. Light emitting devices with coordinates inside the inner ellipse OV1 (shown in cross-hatched) satisfy conditions of the 3-step MacAdam ellipse and can be used as single units. However, light emitting devices with coordinates outside the inner ellipse OV1 do not satisfy 3-step MacAdam ellipse conditions and cannot be used individually. To avoid rejecting and efficiently utilize those (outlier) devices, a plurality of different color tone light emitting devices can be used together to produce merged (color-mixed) light that has chromaticity within the inner ellipse OV1. As a specific case, the annular region between the inner ellipse OV1 and the outer ellipse OV2 is divided into four sections. For example, if the annular region is divided (clockwise) into a first region 91, a third region 93, a second region 92, and a fourth region 94, each opposing pair of regions, which are the first region 91 and the second region 92, and the third region 93 and the fourth region 94, is disposed with the 3-step MacAdam ellipse area intervening in between. Light emitting devices distributed within the annular region sub-divided in this manner are graded and binned as either in the first region 91, second region 92, third region 93, or fourth region 94. Ultimately, when illumination devices are constructed, light emitting devices binned in opposing regions are assembled together. For example, while light emitting devices binned in the first region 91 and the second region 92 are each (individually) outside the 3-step MacAdam ellipse, their merged light can be between the first region 91 and the second region 92 and within the 3-step MacAdam ellipse. Similarly, light emitting devices binned in the third region 93 and the fourth region 94 can be assembled together in an illumination device with merged light having chromaticity between those regions and within the intervening 3-step MacAdam ellipse. This technique allows light emitting devices outside the targeted 3-step MacAdam ellipse to be used to obtain an illumination device that outputs light within a given range of chromaticity.

Figure 11:
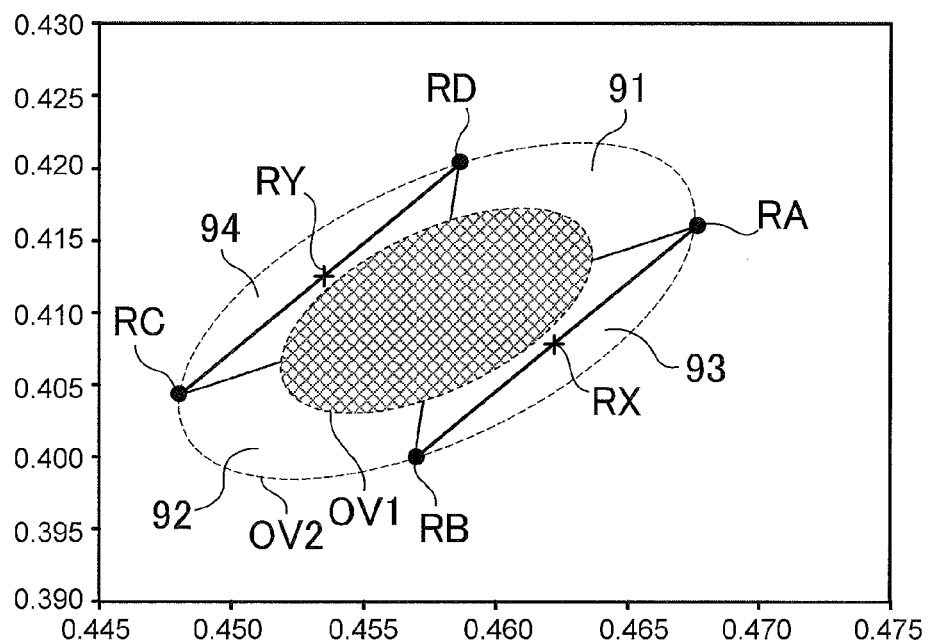
FIG. 11 is the graph of FIG. 10 showing an example where the merged light has chromaticity not within the 3-step MacAdam ellipse.

However, illumination devices produced by this technique have the drawback that they do not necessarily output light with chromaticity inside the 3-step MacAdam ellipse. Specifically, light emitting devices are simply binned into the first region 91 through the fourth region 94, and location within each region is unknown. Accordingly, randomly selected devices from those binned in the first region 91 and the second region 92 may produce merged light that is not within the 3-step MacAdam ellipse. For example, as shown in FIG. 11, if light emitting device chromaticity coordinates are at the points RA and RB, their merged light chromaticity is at the point RX on the line joining RA and RB (outside the 3-step MacAdam ellipse). Similarly, if light emitting devices with chromaticity at points RC and RD are assembled together, their merged light chromaticity is at the point RY on the line joining those points and not within the 3-step MacAdam ellipse. In these types of above-mentioned light emitting device binning schemes, illumination device output may deviate from the targeted chromaticity depending on which binned devices are assembled together. This results in variation in quality of the illumination devices produced, To avoid this outcome, operations can be considered such as recording information indicating the position of each light emitting device within the chromaticity distribution, pre-calculating color tone for merged light from an illumination device using selected light emitting devices, and eliminating device combinations that produce light outside the 3-step MacAdam ellipse. However, this makes it necessary to record chromaticity information for an enormous number of light emitting devices, is very labor-intensive, leads to system complexity, and increases cost. Alternatively, narrowing the divisions of the annular region can be considered. In that case, the binning regions become smaller reducing the number of usable light emitting devices, and this increases cost by requiring additional sorting or device rejection. Consequently, a simple binning method that can keep illumination device output light within the targeted chromaticity range is in demand.

One aspect of the embodiment of the present invention is a method of manufacturing an illumination device that can include a step to prepare a plurality of light emitting devices having different color tones; and a step that establishes on a chromaticity diagram (for binning purposes) a first color tone area and a second color tone area that is outside the first color tone area, further divides the second color tone area into a first region through sixth region, detects the color tone of the prepared plurality of different color tone light emitting devices, and bins (sorts) the light emitting devices into the first region through sixth region depending on color tone.

Another aspect of the embodiment of the present invention is a method of binning light emitting devices that can include a step to prepare a plurality of light emitting devices having different color tones; and a step that establishes on a chromaticity diagram (for binning purposes) a first color tone area and a second color tone area that is outside the first color tone area, further divides the second color tone area into a first region through sixth region, detects the color tone of the prepared (plurality of) different color tone light emitting devices, and bins (sorts) the light emitting devices into the first region through sixth region depending on color tone.

This makes it possible to provide a lower cost method of binning by color tone and method of illumination apparatus manufacture.

Obviously, numerous modifications and variations of the present invention are possible in light of the above teachings. It is therefore to be understood that within the scope of the appended claims, the invention may be practiced otherwise than as specifically described herein.

It should be apparent to those with an ordinary skill in the art that while various embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the spirit and scope of the invention as defined in the appended claims.

What is claimed is:

1. A method of manufacturing an illumination device, comprising:
   detecting a color tone of each of a plurality of light emitting devices having different color tones;
   determining the color tone of each of the plurality of light emitting devices is in which region among a first region, a second region, a third region, a fourth region, a fifth region, and a sixth region on a chromaticity diagram based on the detected color tone, the chromaticity diagram having a first color tone area and a second color tone area in which the first color tone area is provided, the second color tone area being divided into the first region through the sixth region; and
   classifying the plurality of light emitting devices into the first region through the sixth region based on the determined color tone, wherein
   the first region through the sixth region are regions defined by vertices A, B, and C of a triangle that is inscribed inside the second color tone area and has sides that intersect with a perimeter of the first color tone area at three or more points,
   three points D, E, F are provided on a perimeter of the second color tone area, the three points D, E, F being provided on lines that pass through a center O of the second color tone area and that intersect with the vertices A, B, C, respectively, and
   dividing lines AD, BE, and CF are provided that pass through the center O of the second color tone area and divide the second color tone area into six regions including the first region through the sixth region.

2. The method according to claim 1,
   wherein the first region and the second region are provided opposite to each other to sandwich the first color tone area between the first region and the second region on the chromaticity diagram,
   wherein the third region and the fourth region are provided opposite to each other to sandwich the first color tone area between the third region and the fourth region on the chromaticity diagram, and
   wherein the fifth region and the sixth region are provided opposite to each other to sandwich the first color tone area between the fifth region and the sixth region on the chromaticity diagram.

3. The method according to claim 2, further comprising:
   mounting at least one first light emitting device among the plurality of light emitting devices which is classified in the first region and at least one second light emitting device among the plurality of light emitting devices which is classified in the second region with disposition to merge and mix light output from the at least one first light emitting device and the at least one second light emitting device.

4. The method according to claim 2, further comprising:
   mounting at least one third light emitting device among the plurality of light emitting devices which is classified in the third region and at least one fourth light emitting device among the plurality of light emitting devices which is classified in the fourth region with disposition to merge and mix light output from the at least one third light emitting device and the at least one fourth light emitting device.

5. The method according to claim 2, further comprising:
   mounting at least one fifth light emitting device among the plurality of light emitting devices which is classified in the fifth region and at least one sixth light emitting device among the plurality of light emitting devices which is classified in the sixth region with disposition to merge and mix light output from the at least one fifth light emitting device and the at least one sixth light emitting device.

6. The method according to claim 1,
   wherein the triangle inscribes the first color tone area and is inscribed inside the second color tone area having a same center with the first color tone area.

7. The method according to claim 6,
   wherein two of the dividing lines AD, BE, and CF extend in a longitudinal direction of the second color tone area.

8. The method according to claim 1,
   wherein the first color tone area and the second color tone area have elliptical shapes.

9. The method according to claim 1,
   wherein the first color tone area accords with a 3-step MacAdam ellipse.

10. The method according to claim 1,
    wherein the chromaticity diagram comprises a CIE x, y chromaticity diagram or a CIE LUV chromaticity diagram.

11. The method according to claim 1,
    wherein light output from each of the plurality of light emitting devices is merged and mixed to output white-light, and
    wherein a center of the first color tone area is positioned on or along a black-body locus, or towards a x-axis from the black-body locus.

12. The method according to claim 1,
    wherein a reference chromaticity data including a range of chromaticity for color tone classifying on the chromaticity diagram is stored in memory,
    wherein the range of chromaticity includes the first color tone area and the second color tone area in which the first color tone area is provided, and the second color tone area is divided into the first region, the second region, the third region, the fourth region, the fifth region, and the sixth region,
    wherein the first region and the second region are provided opposite to each other to sandwich the first color tone area between the first region and the second region,
    wherein the third region and the fourth region are provided opposite to each other to sandwich the first color tone area between the third region and the fourth region,
    wherein the fifth region and the sixth region are provided opposite to each other to sandwich the first color tone area between the fifth region and the sixth region,
    wherein in determining the color tone, the reference chromaticity data stored in the memory is referred to determine the color tone of each of the plurality of light emitting devices is in which area or region among the first color tone area, the first region, the second region, the third region, the fourth region, the fifth region, and the sixth region based on the detected color tone,
    wherein the method comprises dispatching each of the plurality of light emitting devices into one of a first color tone bin, a first bin, a second bin, a third bin, a fourth bin, a fifth bin, and a sixth bin which are provided to respectively correspond to the first color tone area and the first region through the sixth region based on the determined color tone, and
    wherein the method comprises extracting first light emitting devices among the plurality of light emitting devices and second light emitting devices among the plurality of light emitting devices from the first bin and the second bin, respectively, wherein the method comprises mounting the first light emitting devices and the second light emitting devices on a circuit board with disposition to merge and mix light output from the first light emitting devices and the second light emitting devices.

13. The method according to claim 12, further comprising:

dispatching one light emitting device among the plurality of light emitting devices into a seventh bin if the one light emitting device is determined not belonging to any one of the first color tone area and the first region through the sixth region.

14. The method according to claim 1, wherein the plurality of light emitting devices comprise light emitting diodes.

15. An illumination device manufactured by a method comprising:

detecting a color tone of each of a plurality of light emitting devices having different color tones;

determining the color tone of each of the plurality of light emitting devices is in which region among a first region, a second region, a third region, a fourth region, a fifth region, and a sixth region on a chromaticity diagram based on the detected color tone, the chromaticity diagram having a first color tone area and a second color tone area in which the first color tone area is provided, the second color tone area being divided into the first region through the sixth region; and classifying the plurality of light emitting devices into the first region through the sixth region based on the determined color tone, wherein the first region through the sixth region are regions defined by vertices A, B, and C of a triangle that is inscribed inside the second color tone area and has sides that intersect with a perimeter of the first color tone area at three or more points, three points D, E, F are provided on a perimeter of the second color tone area, the three points D, E, F being provided on lines that pass through a center O of the second color tone area and that intersect with the vertices A, B, C, respectively, and dividing lines AD, BE, and CF are provided that pass through the center O of the second color tone area and divide the second color tone area into six regions including the first region through the sixth region.

16. A method of classifying light emitting devices, comprising:

detecting a color tone of each of a plurality of light emitting devices having different color tones;

determining the color tone of each of the plurality of light emitting devices is in which region among a first region, a second region, a third region, a fourth region, a fifth region, and a sixth region on a chromaticity diagram based on the detected color tone, the chromaticity diagram having a first color tone area and a second color tone area in which the first color tone area is provided, the second color tone area being divided into the first region through the sixth region; and classifying the plurality of light emitting devices into the first region through the sixth region based on the determined color tone, wherein the first region through the sixth region are regions defined by vertices A, B, and C of a triangle that is inscribed inside the second color tone area and has sides that intersect with a perimeter of the first color tone area at three or more points, three points D, E, F being provided on a perimeter of the second color tone area, the three points D, E, F are provided on lines that pass through a center O of the second color tone area and that intersect with the vertices A, B, C, respectively, and dividing lines AD, BE, and CF are provided that pass through the center O of the second color tone area and divide the second color tone area into six regions including the first region through the sixth region.

17. The method according to claim 16, wherein the first region and the second region are provided opposite to each other to sandwich the first color tone area between the first region and the second region on the chromaticity diagram, wherein the third region and the fourth region are provided opposite to each other to sandwich the first color tone area between the third region and the fourth region on the chromaticity diagram, and wherein the fifth region and the sixth region are provided opposite to each other to sandwich the first color tone area between the fifth region and the sixth region on the chromaticity diagram.

18. The method according to claim 16, wherein the triangle inscribes the first color tone area and is inscribed inside the second color tone area having a same center with the first color tone area.

19. The method according to claim 18, wherein two of the dividing lines AD, BE, and CF extend in a longitudinal direction of the second color tone area.

20. The method according to claim 16, wherein the first color tone area and the second color tone area have elliptical shapes.

21. The method according to claim 16, wherein the first color tone area accords with a 3-step MacAdam ellipse.

22. The method according to claim 16, wherein the chromaticity diagram comprises a CIE x, y chromaticity diagram or a CIE LUV chromaticity diagram.

23. The method according to claim 16, wherein light output from each of the plurality of light emitting devices is merged and mixed to output white-light, and wherein a center of the first color tone area is positioned on or along a black-body locus, or towards a x-axis from the black-body locus.

24. The method according to claim 16, wherein the plurality of light emitting devices comprise light emitting diodes.

* * * * *